US010109999B2

(12) United States Patent
Walker

(10) Patent No.: US 10,109,999 B2
(45) Date of Patent: Oct. 23, 2018

(54) TECHNOLOGY FOR EXTENDING A RADIO FREQUENCY (RF) BANDWIDTH OF AN ENVELOPE TRACKING (ET) POWER AMPLIFIER (PA)

(71) Applicant: Raytheon Company, Waltham, MA (US)

(72) Inventor: Mark B. Walker, Waltham, MA (US)

(73) Assignee: Raytheon Company, Waltham, MA (US)

( * ) Notice: Subject to any disclaimer, the term of this patent is extended or adjusted under 35 U.S.C. 154(b) by 1247 days.

(21) Appl. No.: 13/925,433

(22) Filed: Jun. 24, 2013

(65) Prior Publication Data
US 2014/0125135 A1    May 8, 2014

Related U.S. Application Data

(60) Provisional application No. 61/721,924, filed on Nov. 2, 2012.

(51) Int. Cl.
| | |
|---|---|
| H03G 3/20 | (2006.01) |
| H02J 1/00 | (2006.01) |
| H03F 1/02 | (2006.01) |
| H03F 1/30 | (2006.01) |
| H03F 1/56 | (2006.01) |

(52) U.S. Cl.
CPC .............. H02J 1/00 (2013.01); H03F 1/0222 (2013.01); H03F 1/30 (2013.01); H03F 1/56 (2013.01); *Y10T 307/685* (2015.04)

(58) Field of Classification Search
CPC . H03G 3/3042; H03F 2200/451; H03F 3/245; H03F 3/19; H03F 3/195

USPC .......................... 330/136, 126, 127, 296–297
See application file for complete search history.

(56) References Cited

U.S. PATENT DOCUMENTS

| | | | |
|---|---|---|---|
| 7,340,228 B2* | 3/2008 | Monroe | ................ H03F 1/0244 330/129 |
| 7,656,228 B2* | 2/2010 | Fukuda | ................ H03F 1/0288 330/126 |
| 2006/0202764 A1 | 9/2006 | Fukuda et al. | |
| 2008/0079496 A1 | 4/2008 | Thompson et al. | |
| 2008/0129410 A1 | 6/2008 | Fukuda et al. | |

OTHER PUBLICATIONS

Search Report for International application PCT/US2013/057833 dated Feb. 24, 2014, 16 pages.
Nujira, "High Voltage coolteq.h Envelope Tracking Modulator", Nujira Limited, Nov. 2011, pp. 16, Revision 5.0, United Kingdom.

\* cited by examiner

*Primary Examiner* — Khanh V Nguyen
*Assistant Examiner* — Khiem Nguyen

(57) ABSTRACT

An envelope tracking power supply (ET PS) transmission line switch can be operable between an ET PS and a radio frequency (RF) power amplifier (PA). The ET PS transmission line switch assembly can include a quarter wavelength (¼λ) transmission line configured for high impedance at a specified low RF and a switch coupled to a specified point on the quarter wavelength transmission line to generate a high frequency quarter wavelength transmission line when the switch is toggled. The quarter wavelength transmission line is configured to be coupled to a voltage output of the ET PS and a RF output of the RF PA. The high frequency quarter wavelength transmission line is configured for high impedance at a specified high RF, and the specified high RF is higher than the specified low RF.

26 Claims, 7 Drawing Sheets

TECHNOLOGY FOR EXTENDING A RADIO FREQUENCY (RF) BANDWIDTH OF AN ENVELOPE TRACKING (ET) POWER AMPLIFIER (PA)

RELATED APPLICATIONS

This application claims the benefit of U.S. Provisional Patent Application Ser. No. 61/721,924, filed Nov. 2, 2012, which is incorporated by reference herein in its entirety.

BACKGROUND

Radio frequency (RF) power amplifiers (PA) 120 with a fixed voltage supply (e.g., direct current (DC) power supply (PS) 112) can be most efficient at peak power, as illustrated in FIG. 1A. Efficiency of the RF PA can be worse at lower power levels. Thus, power amplifiers with a high peak-to-average (PAR) waveform (e.g. PA used in Mobile User Objective System (MUOS)) can be inherently inefficient. MUOS is an array of geosynchronous satellites developed for the United States Department of Defense (DoD) to provide narrowband (e.g., 64 kilobits per second (kbit/s) and below) connectivity for global satellite communications (SATCOM) for use by the United States and its allies.

Envelope tracking power supplies (ET PS) 110 can be used to improve energy efficiency of RF power amplifiers, as illustrated in FIG. 1B. An ET PS can replace a fixed direct current (DC) supply voltage 112 to the RF PA 120 with a dynamic supply voltage 142, which closely tracks an amplitude, or envelope of a transmitted RF signal 140.

Referring back to FIG. 1A, RF PAs can be supplied with a fixed DC voltage 112, but may only be energy efficient when the RF PAs are in compression (e.g., at the peaks of the transmitted waveform). Most of the time, the supply voltage 144 can be far higher than the transmission voltage 140 (or transmitted RF signal), and the excess power can be dissipated as heat 148 in the PA device. For example, with orthogonal frequency-division multiplexing (OFDM) signals up to 80% of the energy in the PA can be wasted (dissipated as heat).

Referring back to FIG. 1B, envelope tracking can work by dynamically adjusting the supply voltage 142 to the signal generated by the PA 120, which can maximize the energy efficiency (e.g., reduce the heat dissipation 146) of the PA by keeping the transmitted RF signal 140 in compression over a whole modulation cycle, instead of just at the peaks.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein.

Figure 1A:
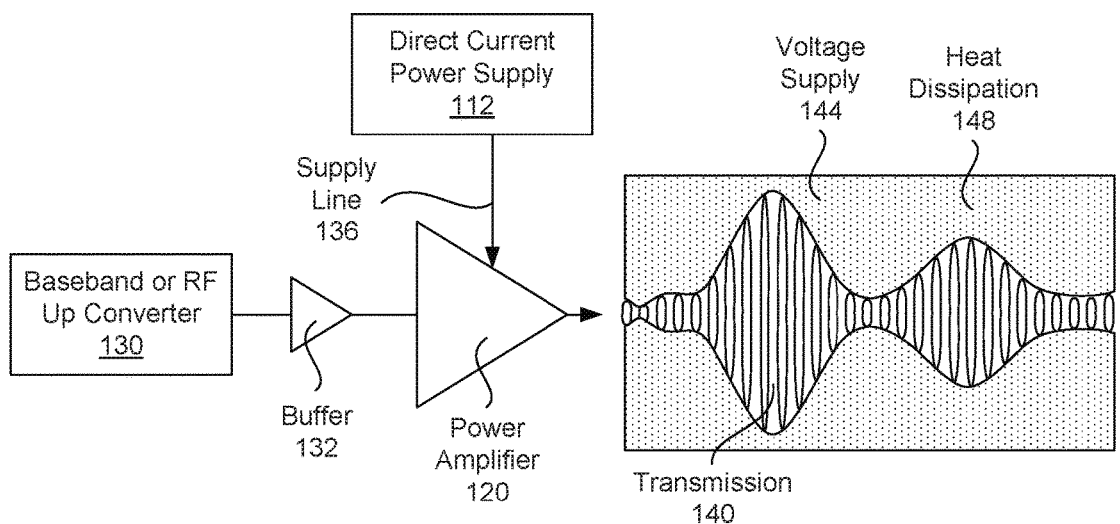
FIG. 1A illustrates a diagram of an direct current (DC) power supply (PS) and a radio frequency (RF) power amplifier (PA) in accordance with an example.

Reference will now be made to the exemplary embodiments illustrated, and specific language will be used herein to describe the same. It will nevertheless be understood that no limitation of the scope of the invention is thereby intended.

DETAILED DESCRIPTION

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence.

EXAMPLE EMBODIMENTS

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

As illustrated in FIG. 1A, a radio frequency (RF) input signal to the power amplifier (PA) can be generated by a baseband or RF up converter 130 and buffered by a buffer 132. The direct current (DC) power supply can provide the power to the PA via a transmission line (or feed line or voltage supply line) 136.

Figure 1B:
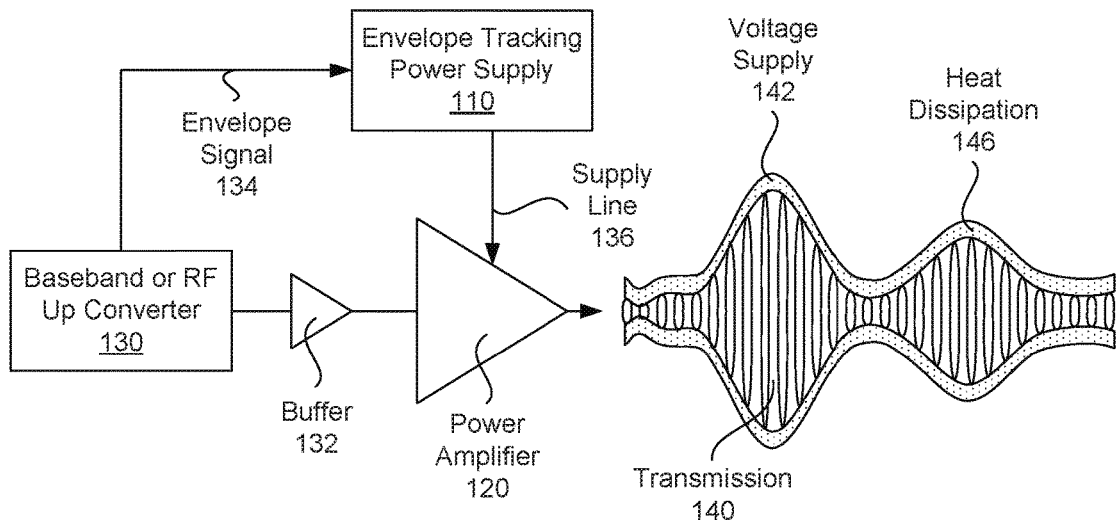
FIG. 1B illustrates a diagram of an envelope tracking power supply (ET PS) and a radio frequency (RF) power amplifier (PA) in accordance with an example.

As illustrated in FIG. 1B, the baseband or RF up converter 130 can provide an envelope signal 134 to control the dynamic envelope voltage of the envelope tracking power supplies (ET PS) 110. ET PS can improve efficiency, but the ET PS can be limited by the RF bandwidth of the PA. Many implementations of an ET PS can be used in narrowband communications. For example, the ET PS can be limited by a bandwidth of 2.3 to 3.5 gigahertz (GHz) in commercial wireless phone technology, so the relatively narrow bandwidth of the ET PS may not impaired by the narrowband communications.

In other applications, devices may use broadband communication (e.g., 30 Megahertz (MHz) to 60 GHz), such as military communications. In broadband communications, the ET PS may be inoperable at various frequencies (depending on the wavelength of the transmission frequency), which can prohibit the use of the ET PS in broadband communications (e.g., military communications), which can result in either inefficient radios (e.g., unable to use the ET PS) or radios unable to operate in a full broad bandwidth. The ET PS RF limitation can be due to a quarter-wavelength (¼λ) line, which can be incorporated in the RF PA feed (e.g., drain or collector of the PA) or the transmission line 136 between the ET PS 110 and the PA 120, as illustrate in FIG. 1B. The ¼λ line can limit the RF bandwidth of the PA. For instance, the ¼λ line can have a physical dimension of one quarter-wavelength of a RF band F1. The wavelength (A) can be inversely proportional to the frequency band. For example, if the RF band F1 is 2.5 GHz, the wavelength is 11.992 centimeters (cm) and the ¼λ line can be approximately 3 cm. The ET PS can operate efficiently at any odd multiple of the ¼λ line (e.g., ¾λ line, 5/4λ line, 7/4λ line, so forth—repeating like a sine wave) for the RF band F1. The ET PS can be inoperable at any even multiple of the ¼λ line (e.g., ½λ line, λ line, ¾λ line, 2λ line, so forth— repeating like a sine wave). ET PS can work inefficiently with a RF PA feed (e.g., feed line or transmission line) as the length varies from the ¼λ line and approaches the length of the even multiple of the ¼λ line.

Figure 5:
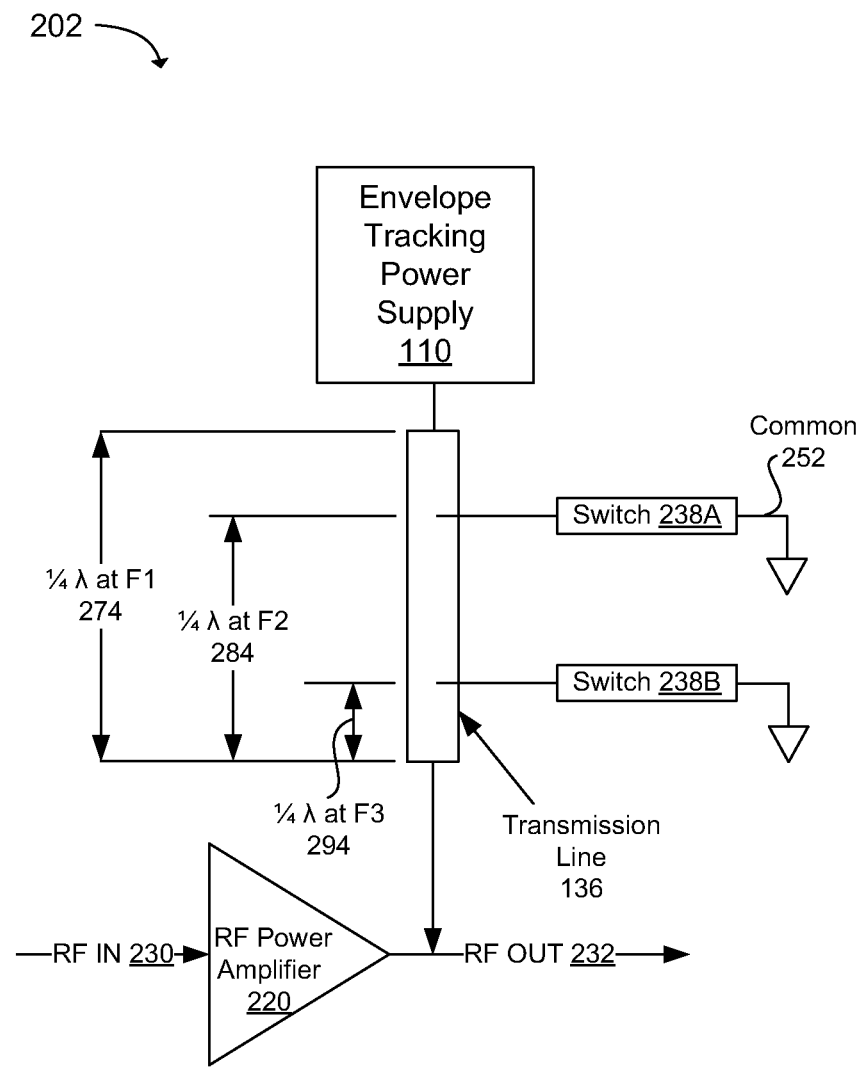
FIG. 5 illustrates a diagram of multiple envelope tracking power supply (ET PS) transmission line switch operable between an ET PS and a radio frequency (RF) power amplifier (PA) in accordance with an example.

The ¼λ feed line or transmission line between the ET PS and the RF PA can limit the bandwidth of a radio to a narrow bandwidth radio. In an example, a wideband ET PS RF PA can electrically add a bypass (or AC short) at different locations on the ¼λ line (depending on the frequency band), which can effectively alter the electrical length of the PA drain feed. Electrically adding a bypass on the ¼λ line can be implemented using a switch, such as low cost P-type, near intrinsic, N-type (PIN) switch or a gallium arsenide (GaAs) microelectromechanical system (MEMS) switch. The RF currents through the bypass switch can be low and may not create a current capacity issue for the switch. Using multiple switches 238 (or switch assemblies) can be used to further extend operating frequency of the ET PS 110, as illustrated in FIG. 5

A PIN switch can be lightly doped 'near' intrinsic semiconductor region between a p-type semiconductor and an n-type semiconductor region, which can generate a wide intrinsic region. The wide intrinsic region can make the PIN switch a fast switch, which can be used in high voltage power electronics applications. Typically, the p-type and n-type regions are heavily doped for ohmic contacts. PIN switch may be capable of handling the current for the bypass. In an example the PIN switch can be fabricated from GaAs.

An RF MEMS switch can have electronic components where moving sub-millimeter-sized parts provide RF functionality. RF functionality can be implemented using a variety of RF technologies along with III-V compound semiconductor (e.g., GaAs, gallium nitride (GaN), indium phosphide (InP), indium antimonide (InSb), ferrite, ferroelectric, silicon-based semiconductor (e.g., RF complementary metal-oxide-semiconductor (CMOS), silicon carbide (SiC), and silicon-germanium (SiGe)) technologies. Each of the RF technologies can offer a distinct trade-off between cost, frequency, gain, large-scale integration, lifetime, linearity, noise figure, packaging, power handling, power consumption, reliability, ruggedness, size, supply voltage, switching time, and weight.

Figure 2:
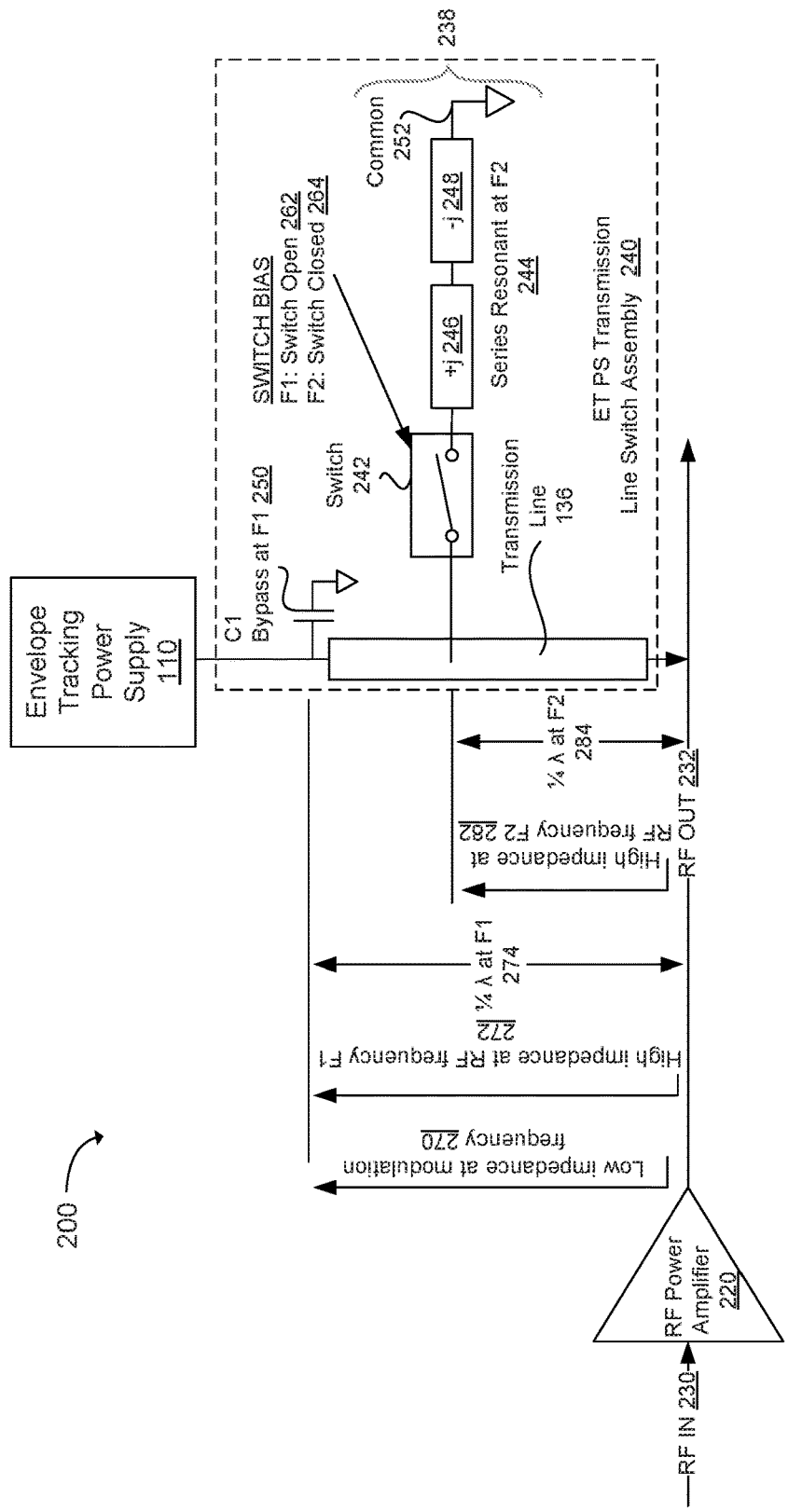
FIG. 2 illustrates a diagram of an envelope tracking power supply (ET PS) transmission line switch operable between an ET PS and a radio frequency (RF) power amplifier (PA) in accordance with an example.

FIG. 2 illustrates an example of an ET PS transmission line switch assembly 240, wherein the assembly can comprise one or more ET PS transmission line switches (e.g., ET PS transmission line switch 238). The ET PS transmission line switch 238, and particularly the switch element 242, can be coupled to a point on the transmission line 136 to form a ¼λ line at frequency F2 284 when the switch 238 is closed 264, where the transmission line provides a RF PA feed from the ET PS 110 to the RF PA 220. The ¼λ line at a frequency F2 can provide a high impedance at RF frequency F2 282 looking into the path of the transmission line 136 from the RF OUT 232 to the ET PS 110. The frequency F2 can have a higher frequency than frequency F1. The F1 frequency can be a lowest frequency used by the RE PA. A capacitor C1 can provide a bypass at frequency F1 250 at the ET PS end of the transmission line. The C1 can short the AC component of the feed to a common voltage 252 (e.g., ground voltage or ground connection) to form a ¼λ line at frequency F1 274 when the ET PS transmission line switch 238 is open 262. The ground connection may be a direct current (DC) voltage contact with a voltage less than a reference voltage or center voltage of a RF signal. The ¼λ line at a frequency F1 can provide a high impedance at RF frequency F1 272 looking into the path of the transmission line 136 from the RF OUT 232 to the ET PS 110 (e.g., the angled arrow represents "looking into that path"), and a low impedance at the modulation frequency 270 looking into the path of the transmission line 136 from the RE OUT 232 to the ET PS 110.

Electrical impedance is the measure of the opposition that a circuit presents to the passage of a current when a voltage is applied. In quantitative terms, impedance is the complex ratio of the voltage to the current in an alternating current (AC) circuit. Impedance includes a real component (i.e., resistance) and an imagery component (i.e., reactance) for alternating current (AC) or RF circuits, and possesses both magnitude and phase, unlike resistance, which has only magnitude. Resistance is impedance with a zero phase angle. Reactance is impedance with a 90° (or 2/π) phase angle. Reactance is the opposition of a circuit element to a change of electric current or voltage, due to that element's inductance or capacitance. Resistance can be generated by resistors and reactance can be generated by inductors (+j 246) or capacitors (−j 248).

The ET PS transmission line switch 238 bias can either be open 262 or closed 264. The switch 238 can be toggled by a digital control line with control logic. In an example, the switch 238 can change semi-statically. The F1 or F2 frequency can be based on the frequency band of the RF input (RE IN) signal 230 of the RE PA 220, where the RF PA generates a RE output (RE OUT) signal 232. In an example, the transmission line 136 can be coupled to the RE OUT.

In an example, the ET PS transmission line switch 238 can be coupled to the common voltage (e.g., a short) to form the ¼λ line for a frequency F2. In another example, a parasitic circuit (or anti-parasitic circuit) may be used to remove the parasitic effect of the ET PS transmission line switch. In an example, the parasitic circuit can include reactive elements (e.g., inductor 246 and capacitor 248) to generate a series resonant circuit at F2 244. The series resonant circuit can eliminate the parasitic effect of the ET PS transmission line switch at the F2 frequency. In electrical networks, a parasitic element is a circuit element (e.g., resistance, inductance or capacitance) that is possessed by an electrical component (e.g., transistor, resistor, inductor, capacitor, or switch) but which effect is not desirable for the electrical component to have for the electrical component's intended purpose. For instance, a resistor is designed to possess resistance, but can also possess unwanted parasitic capacitance. An inductor is designed to possess inductance, but can also possess unwanted parasitic resistance. The ET PS transmission line switch is designed to have an open and closed state, but can also possess unwanted parasitic resistance and capacitance. The parasitic circuit can reduce the parasitic effect of the switch, which can be even more valuable when multiple ET PS transmission line switches are used to generate a plurality of different ¼λ lines for various frequencies (e.g., F1, F2, or F3).

PA efficiency over a wide bandwidth can be a demanding specification. The ET PS transmission line switch assembly 240 can be used to improve the PA efficiency over a wide bandwidth (e.g., 30 MHz to 3 GHz). Prior to the development of the ET PS, PA efficiency with high peak-to-average ratio (PAPR) has been difficult to achieve. With computerized ET PS and the ET PS transmission line switch assembly, the RE bandwidth can be extended, which can extend a battery life to RE PA (e.g., used in a radio), lower thermal dissipation of the RF PA, reduce heat sinks, and reduce the weight of the radio (e.g., often heat sinks are made of metal which can increase the weight of a radio). Various standards and specifications can require the use of smaller, lower cost RF devices (e.g., due to lower thermal constraints). The ET PS transmission line switch assembly can be implemented to provide efficient wide RF bandwidth device (e.g., radios) to meet the tighter requirements of various standards and specifications.

Figure 3:
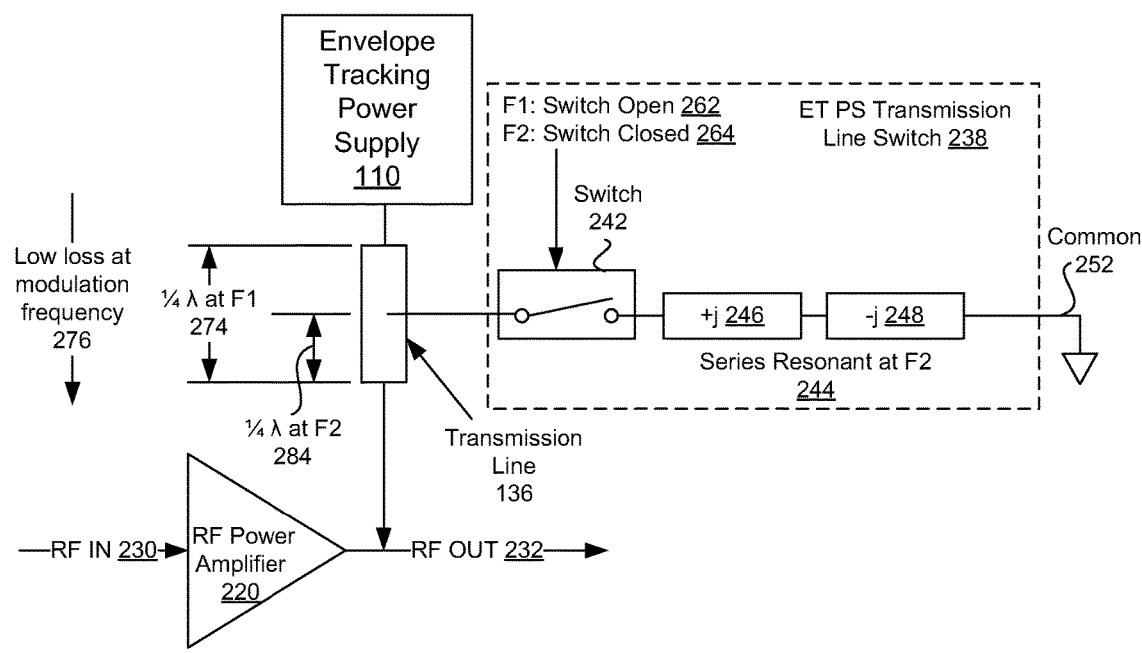
FIG. 3 illustrates a diagram of an envelope tracking power supply (ET PS) transmission line switch operable between an ET PS and a radio frequency (RF) power amplifier (PA) in accordance with an example.

FIG. 3 illustrates another example of an ET PS transmission line switch 238 (as part of an ET PS transmission line switch assembly). The ET PS transmission line switch 238 can provide low loss at a modulation frequency 276. Electrical length of transmission line 136 can be altered by the switch element 242 and series resonant circuit 244 (e.g., +j 246 and −j 248). The value can be such that modulation bandwidth is not altered, and the reactance −j and +j can cancel each other. The ET PS transmission line switch 238 can provide a high impedance at desired radio frequency (e.g., F2) with a length of ¼λ at the desired frequency.

Figure 4:
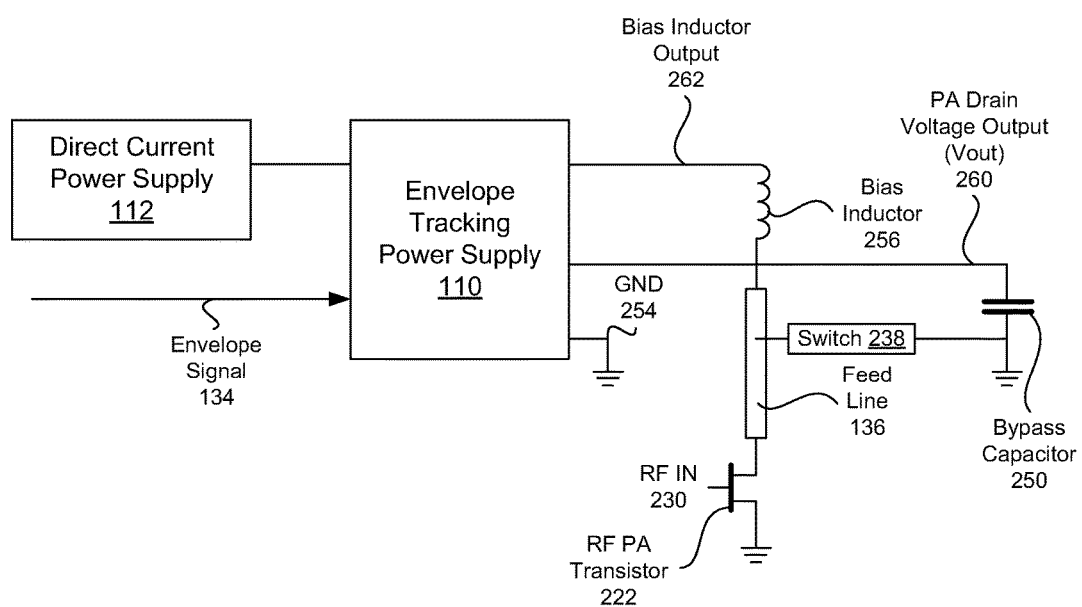
FIG. 4 illustrates a diagram of an envelope tracking power supply (ET PS) transmission line switch operable between an ET PS and a radio frequency (RF) power amplifier (PA) transistor in accordance with an example.

FIG. 4 illustrates another configuration of an ET PS transmission line switch 238 (as part of an ET PS transmission line switch assembly) operable between an ET PS 110 and a radio frequency (RF) power amplifier (PA) transistor 222. The ET PS can be powered by a DC PS 112 and receive the envelope signal 134 to control the dynamic voltage envelope. The FT PS can be connected to a ground connection (GND) 254 and provide a bias inductor output 262 and a PA drain voltage output (Vout) 260. A bias inductor 256 can be used between the bias inductor output and the Vout. The bypass capacitor 250 can be coupled to the Vout forming a feed line 136 for the RF PA transistor. The ET PS transmission line switch 238 can provide at least two ¼ λ feed lines for two frequency bands, which can broaden the bandwidth of the RF PA over using a single ¼λ feed line without using a switch.

FIG. 5 illustrates another example of multiple ET PS transmission line switches 238A-B (as part of an ET PS transmission line switch assembly). A first ET PS transmission line switch 238A can be used to form a ¼λ line at frequency F2 284 and a second ET PS transmission line switch 238B can be used to form a ¼λ line at frequency F3 294. The first switch 238A can be coupled to a point on the transmission line 136 to form a ¼ λ line at frequency F2 284 when the first switch is closed. The second switch 238B can be coupled to a point on the transmission line to form a ¼λ line at frequency F2 294 when the second switch is closed.

The ET PS transmission line switch (or switch assembly) can provide an advantage over electrically switch in line segments on the ¼λ line. Switching in a line length can be cumbersome and may not be easy to implement. Switching in the line length can alter the length of the ¼λ line by adding additional segments. Switching in the line length may need to have a low impedance and be able to handle high currents, which may be difficult to implement. The ET PS transmission line switch can provide an easier mechanism to design and implement for generating an efficient broadband RF PA.

Referring back to FIG. 2, in an example, the envelope tracking power supply (ET PS) transmission line switch assembly 240 can be operable between an ET PS 110 and a radio frequency (RE) power amplifier (PA) 220. The ET PS transmission line switch can include a quarter wavelength (¼λ) transmission line 136 or 274 configured for high impedance at a specified low RE 272 looking into the path of the transmission line 136 from the RF OUT 232 to the ET PS 110. The quarter wavelength transmission line can be configured to be coupled to a voltage output of the ET PS and a RE output 232 of the RE PA. A switch element 242 of the ET PS transmission line switch 238 can be coupled to a specified point on the quarter wavelength transmission line to generate a high frequency quarter wavelength transmission line 284 when the switch is toggled. The high frequency quarter wavelength transmission line can be configured for high impedance at a specified high RE 282 looking into the path of the transmission line 136 from the RE OUT 232 to the ET PS 110. The specified high RF can be higher than the specified low RF.

In another example, the high frequency quarter wavelength transmission line can be configured for low impedance at a modulation frequency 270 looking into the path of the transmission line 136 from the RF OUT 232 to the ET PS 110. The ET PS transmission line switch 238 can generate a reactance bypass to a common voltage reference point 252 when the switch is toggled. In an example, the ET PS transmission line switch 238 includes a parasitic circuit to reduce a parasitic effect of the switch. The parasitic circuit includes an inductor 246 in series with a capacitor 248 to generate a series resonant circuit 244 at the specified high RF. In an example, the specified high RE can be higher than the specified low RF by at least an octave (i.e., at least twice the specified low RF). For example, the specified high RF can be greater than or equal to twice the specified low RE (e.g., F2≥2*F1). In another example, the specified high RF can be higher than the specified low RF by at least a decade (i.e., at least ten times the specified low RF). For example, the specified high RE can be greater than or equal to ten times the specified low RF (e.g., F2≥0.10*F1).

In another configuration, the ET PS transmission line switch assembly 240 can be used in a broadband communication device and the ET PS transmission line switch assembly can facilitate in switch between carrier frequencies in a range from 30 Megahertz (MHz) to 60 Gigahertz (GHz). In an example, the ET PS transmission line switch can include a PIN switch, a gallium arsenide (GaAs) microelectromechanical system (MEMS) switch, or a digitally controlled switch. The PIN switch can include a switch with an intrinsic semiconductor region between a p-type semiconductor and an n-type semiconductor region. In another example, the switch includes a PIN gallium arsenide (GaAs) switch, and the PIN GaAs switch includes a switch with an intrinsic semiconductor region between a p-type semiconductor and an n-type semiconductor region.

In another configuration, a radio frequency (RF) power amplifier (PA) system 200 can use the ET PS transmission line switch assembly 240. The RF PA system can include an ET PS 110, a RF PA 220, and the ET PS transmission line switch. The ET PS can be configured to dynamically adjust a power supply of a RF PA to an amplitude of a input RF signal 230. The RF PA can be controlled by a voltage of the ET PS. The ET PS transmission line switch can be coupled between a voltage output of the ET PS and a RF output 232 of the RE PA via the quarter wavelength transmission line 136.

In another example, a radio frequency (RF) power amplifier (PA) system 202 can use the ET PS transmission line switches 238A-B, as shown in FIG. 5, the plurality of ET PS transmission line switches 238A-B being part of an ET PS transmission line switch assembly. Each ET PS transmission line switch can be coupled to a different specified point on the quarter wavelength transmission line to generate a plurality of high frequency quarter wavelength transmission lines 284 and 294 for a plurality of specified high RFs. Each high frequency quarter wavelength transmission line can be configured for high impedance at one of the specified high RF.

Figure 6:
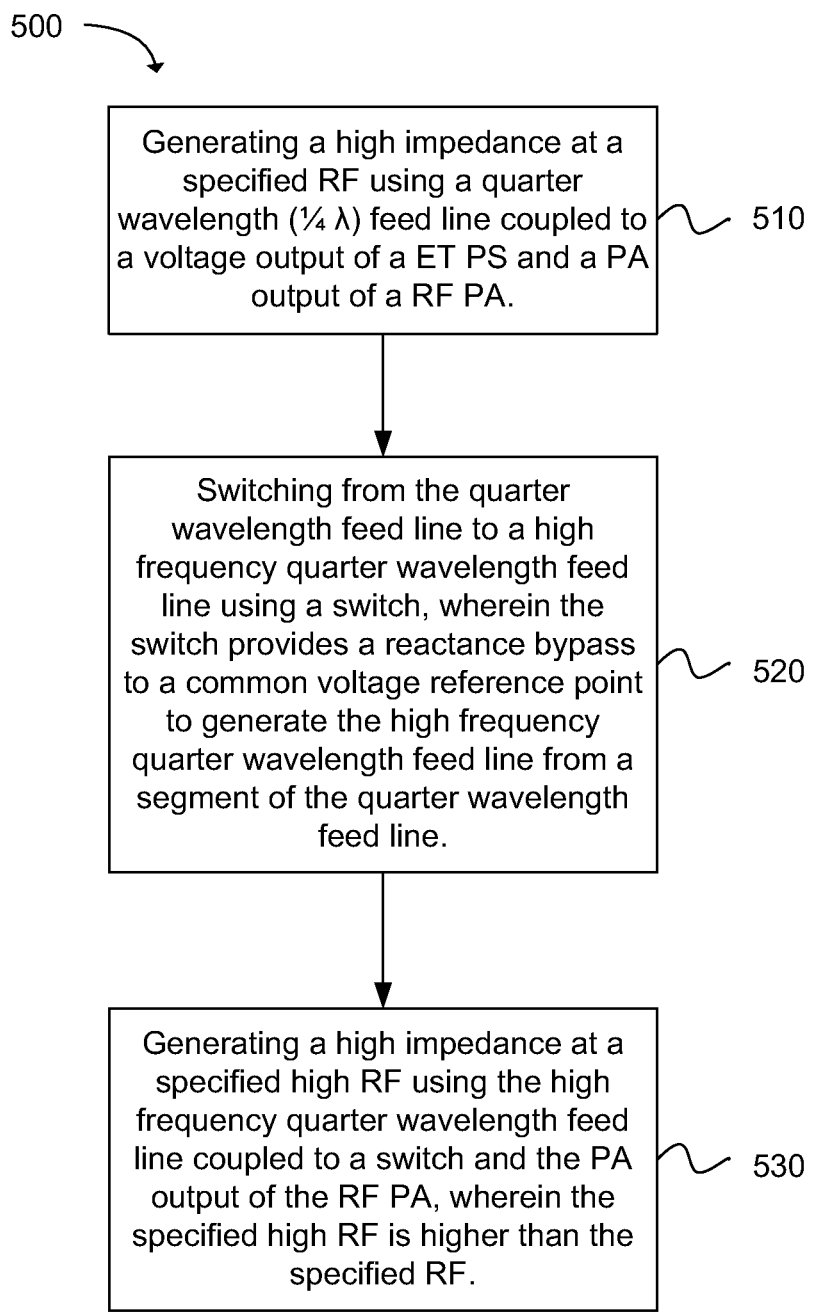
FIG. 6 depicts a flow chart of a method for extending-radio frequency (RF) bandwidth of an envelope tracking (ET) RF power amplifier (PA) in accordance with an example.

Another example provides a method 500 for extending a radio frequency (RF) bandwidth of an envelope tracking (ET) RF power amplifier (PA), as shown in the flow chart in FIG. 6. The method may be executed as instructions on a machine, computer circuitry, or a processor, where the instructions are included on at least one computer readable medium or one non-transitory machine readable storage medium. The method includes the operation of generating a high impedance at a specified RF using a quarter wavelength ($\frac{1}{4}\lambda$) feed line coupled to a voltage output of a ET PS and a PA output of a RF PA, as in block 510. The operation of switching from the quarter wavelength feed line to a high frequency quarter wavelength feed line using a switch, wherein the switch provides a reactance bypass to a common voltage reference point to generate the high frequency quarter wavelength feed line from a segment of the quarter wavelength feed line follows, as in block 520. The next operation of the method can be generating a high impedance at a specified high RF using the high frequency quarter wavelength feed line coupled to a switch and the PA output of the RF PA, wherein the specified high RF is higher than the specified RF, as in block 530.

In an example, the specified high RF can be higher than the specified RF by at least an octave (or at least twice the specified RF). The common voltage reference point can be a ground reference point. A range of the RF PA for at least two carrier frequencies can be from 30 Megahertz (MHz) to 60 Gigahertz (GHz).

In another example, the method can further include compensating for a parasitic effect of the switch using a parasitic circuit. The parasitic circuit can include a reactance circuit element to generate resonance at the specified high RF. In a configuration, the reactance circuit element can include a capacitor or an inductor.

In another configuration, the method can further include canceling reactance of the switch using a parasitic circuit. The parasitic circuit can include a reactance circuit element to generate resonance at the specified high RF.

Figure 7:
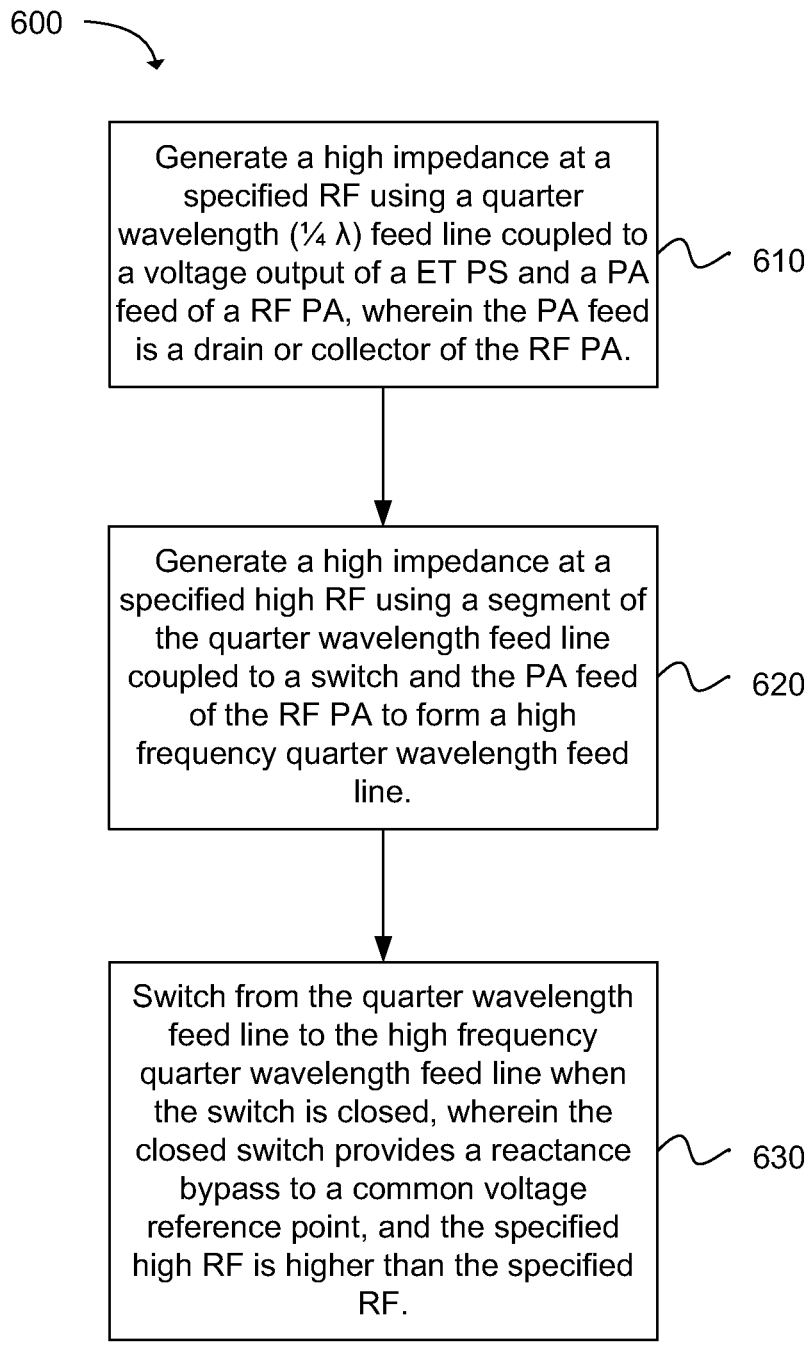
FIG. 7 depicts functionality of computer circuitry of an envelope tracking power supply (ET PS) feed line switch for extending a radio frequency (RF) bandwidth of an envelope tracking (ET) RF power amplifier (PA) in accordance with an example.

Another example provides functionality 600 of computer circuitry of an envelope tracking power supply (ET PS) feed line switch assembly, for extending a radio frequency (RF) bandwidth of an envelope tracking (ET) RF power amplifier (PA), as shown in the flow chart in FIG. 7. The functionality may be implemented as a method or the functionality may be executed as instructions on a machine, where the instructions are included on at least one computer readable medium or one non-transitory machine readable storage medium. The computer circuitry can be configured to generate a high impedance at a specified RF using a quarter wavelength ($\frac{1}{4}\lambda$) feed line coupled to a voltage output of a ET PS and a PA feed of a RF PA, wherein the PA feed is a drain or collector of the RF PA, as in block 610. The computer circuitry can be further configured to generate a high impedance at a specified high RF using a segment of the quarter wavelength feed line coupled to an ET PS transmission line switch and the PA feed of the RF PA to form a high frequency quarter wavelength feed line, as in block 620. The computer circuitry can also be configured to switch from the quarter wavelength feed line to the high frequency quarter wavelength feed line when the switch is closed, wherein the closed switch provides a reactance bypass to a common voltage reference point, and the specified high RF is higher than the specified RF, as in block 630.

In an example, the quarter wavelength feed line can have a length approximately equal to a quarter wavelength of the specified RF. The high frequency quarter wavelength feed line can have a length approximately equal to a quarter wavelength of the specified high RF. The computer circuitry can be further configured to generate a low impedance at the specified RF using the quarter wavelength feed line.

In another example, the computer circuitry can be further configured to compensate for a parasitic effect of the switch using a parasitic circuit. The parasitic circuit can include a reactance circuit element to generate resonance at the specified high RF, and the reactance circuit element can include a capacitor or an inductor.

Various techniques, or certain aspects or portions thereof, may take the form of program code (i.e., instructions) embodied in tangible media, such as floppy diskettes, CD-ROMs, hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device may include a processor, a storage medium readable by the processor (including volatile and non-volatile memory and/or storage elements), at least one input device, and at least one output device. The volatile and non-volatile memory and/or storage elements may be a RAM, EPROM, flash drive, optical drive, magnetic hard drive, solid state drive, or other medium for storing electronic data. The switch may also include a transceiver module (i.e., transceiver), a counter module (i.e., counter), a processing module (i.e., processor), and/or a clock module (i.e., clock) or timer module (i.e., timer). One or more programs that may implement or utilize the various techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

It should be understood that many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. The modules may be passive or active, including agents operable to perform desired functions.

Reference throughout this specification to "an example" or "exemplary" means that a particular feature, structure, or characteristic described in connection with the example is included in at least one embodiment of the present invention. Thus, appearances of the phrases "in an example" or the word "exemplary" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as defacto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of layouts, distances, network examples, etc., to provide a thorough understanding of embodiments of the invention. One skilled in the relevant art will recognize, however, that the invention can be practiced without one or more of the specific details, or with other methods, components, layouts, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. An envelope tracking power supply (ET PS) transmission line switch assembly operable between an ET PS and a radio frequency (RF) power amplifier (PA) (RF PA), the ET PS transmission line switch assembly comprising:
    a quarter wavelength (¼λ) transmission line configured for high impedance at a specified low RF, wherein the quarter wavelength transmission line is coupled to a voltage terminal of the ET PS and a RF output of the RF PA; and
    an ET PS transmission line switch coupled to a point on the quarter wavelength transmission line to generate a high frequency quarter wavelength transmission line when the ET PS transmission line switch is toggled, wherein the high frequency quarter wavelength transmission line is configured for high impedance at a specified high RF, and the specified high RF is higher than the specified low RF.

2. The ET PS transmission line switch assembly of claim 1, wherein the high frequency quarter wavelength transmission line is configured for low impedance at a modulation frequency.

3. The ET PS transmission line switch assembly of claim 1, wherein the ET PS transmission line switch generates a reactance bypass to a common voltage reference point when the ET PS transmission line switch is toggled.

4. The ET PS transmission line switch assembly of claim 1, wherein the ET PS transmission line switch includes a parasitic circuit to reduce a parasitic effect of the ET PS transmission line switch.

5. The ET PS transmission line switch assembly of claim 4, wherein the parasitic circuit includes an inductor in series with a capacitor to generate a series resonant circuit at the specified high RF.

6. The ET PS transmission line switch assembly of claim 1, wherein the specified high RF is higher than the specified low RF by at least an octave or at least twice the specified low RF.

7. The ET PS transmission line switch assembly of claim 1, wherein the specified high RF is higher than the specified low RF by at least a decade or at least ten times the specified low RF.

8. The ET PS transmission line switch of claim 1, wherein the quarter wavelength transmission line is coupled to a bypass capacitor at the voltage output of the ET PS and a common voltage reference point to provide a specified low RF bypass.

9. The ET PS transmission line switch assembly of claim 1, wherein the ET PS transmission line switch is used in a broadband communication device and the ET PS transmission line switch can facilitate in switch between carrier frequencies in a range from 30 Megahertz (MHz) to 60 Gigahertz (GHz).

10. The ET PS transmission line switch assembly of claim 1, wherein the ET PS transmission line switch comprises a type of switch selected from the group consisting of a PIN switch, a gallium arsenide (GaAs) microelectromechanical system (MEMS) switch, and a digitally controlled switch.

11. The ET PS transmission line switch assembly of claim 1, wherein the ET PS transmission line switch includes a PIN switch fabricated from gallium arsenide (GaAs).

12. A radio frequency (RF) power amplifier (PA) system, comprising:
an envelope tracking power supply (ET PS) transmission line switch assembly operable between an ET PS and a radio frequency (RF) power amplifier (PA) (RF PA), the ET PS transmission line switch assembly comprising:
a quarter wavelength (¼λ) transmission line configured for high impedance at a specified low RF, wherein the quarter wavelength transmission line is coupled to a voltage terminal of the ET PS and a RF output of the RF PA; and
a plurality of ET PS transmission line switches, wherein each ET PS transmission line switch is coupled to a different point on the quarter wavelength transmission line to generate a plurality of high frequency quarter wavelength transmission lines for a plurality of specified high RFs, wherein each high frequency quarter wavelength transmission line is configured for high impedance at one of the specified high RF.

13. A radio frequency (RF) power amplifier (PA) system using the ET PS transmission line switch assembly of claim 1, comprising:
an envelope tracking power supply (ET PS) configured to dynamically adjust a power supply of a radio frequency (RF) power amplifier (PA) (RF PA) to an amplitude of an input RF signal,
the RF PA with a voltage controlled by the ET PS; and
the ET PS transmission line switch assembly of claim 1, coupled between a voltage output of the ET PS and a RF output of the RF PA via the quarter wavelength transmission line.

14. An envelope tracking power supply (ET PS) feed line switch assembly for extending a radio frequency (RF) bandwidth of an envelope tracking (ET) RF power amplifier (PA) (RF PA), operable with a computer having computer circuitry configured to:
generate a high impedance at a specified RF using a quarter wavelength (¼λ) feed line coupled to a voltage terminal of a ET PS and a PA feed of a radio frequency (RF) power amplifier (PA) (RF PA), wherein the PA feed is a drain or collector of the RF PA;
generate a high impedance at a specified high RF using a segment of the quarter wavelength feed line coupled to an ET PS transmission line switch and the PA feed of the RF PA to form a high frequency quarter wavelength feed line; and
switch from the quarter wavelength feed line to the high frequency quarter wavelength feed line when the ET PS transmission line switch is closed, wherein the closed ET PS transmission line switch provides a reactance bypass to a common voltage reference point, and the specified high RF is higher than the specified RF.

15. The computer circuitry of claim 14, wherein the quarter wavelength feed line has a length approximately equal to a quarter wavelength of the specified RF, and the high frequency quarter wavelength feed line has a length approximately equal to a quarter wavelength of the specified high RF.

16. The computer circuitry of claim 14, further configured to:
generate a low impedance at the specified RF using the quarter wavelength feed line.

17. The computer circuitry of claim 14, further configured to:
compensate for a parasitic effect of the ET PS transmission line switch using a parasitic circuit, wherein the parasitic circuit includes a reactance circuit element to generate resonance at the specified high RF, and the reactance circuit element includes a capacitor or an inductor.

18. A method for extending a radio frequency (RF) bandwidth of an envelope tracking (ET) RF power amplifier (PA), comprising:
generating a high impedance at a specified RF using a quarter wavelength (¼λ) feed line coupled to a voltage terminal of a ET PS and a PA output of a radio frequency (RF) power amplifier (PA) (RF PA);
switching from the quarter wavelength feed line to a high frequency quarter wavelength feed line using a ET PS transmission line switch, wherein the ET PS transmission line switch provides a reactance bypass to a common voltage reference point to generate the high frequency quarter wavelength feed line from a segment of the quarter wavelength feed line; and
generating a high impedance at a specified high RF using the high frequency quarter wavelength feed line coupled to the ET PS transmission line switch and the PA output of the RF PA, wherein the specified high RF is higher than the specified RF.

19. The method of claim 18, wherein the specified high RF is higher than the specified RF by at least an octave or at least twice the specified RF, the common voltage reference point is a ground reference point, and a range of the RF PA for at least two carrier frequencies is from 30 Megahertz (MHz) to 60 Gigahertz (GHz).

20. The method of claim 18, further comprising:
compensating for a parasitic effect of the ET PS transmission line switch using a parasitic circuit, wherein the parasitic circuit includes a reactance circuit element to generate resonance at the specified high RF, and the reactance circuit element includes a capacitor or an inductor.

21. The method of claim 18, further comprising:
canceling reactance of the switch using a parasitic circuit, wherein the parasitic circuit includes a reactance circuit element to generate resonance at the specified high RF.

22. At least one non-transitory machine readable storage medium comprising a plurality of instructions adapted to be executed to implement the method of claim 18.

23. The radio frequency (RF) power amplifier (PA) system using the ET PS transmission line switch assembly of claim 12, wherein the plurality of ET PS transmission line switches are operable to be toggled.

24. The method of claim 18, further comprising:
switching from the high frequency quarter wavelength feed line to a higher frequency quarter wavelength feed line using a plurality of ET PS transmission line switches, wherein the plurality of ET PS transmission line switches provide a reactance bypass to a common voltage reference point to generate the higher frequency quarter wavelength feed line from a segment of the high frequency quarter wavelength feed line.

25. The method of claim 24, wherein switching from the quarter wavelength feed line to the high frequency quarter wavelength feed line, and wherein switching from the high frequency quarter wavelength feed line to the higher frequency quarter wavelength feed line comprises:

first operating a first ET PS transmission line switch furthest away from the RF PA to generate the high frequency quarter wavelength feed line, and second, operating a second ET PS transmission line switch that is the next furthest away from the RF PA to generate the higher frequency quarter wavelength feed line.

26. An envelope tracking power supply (ET PS) transmission line switch assembly operable between an ET PS and a radio frequency (RF) power amplifier (PA), the ET PS transmission line switch assembly comprising:

a quarter wavelength (¼λ) transmission line configured for high impedance at a specified low RF, wherein the quarter wavelength transmission line is coupled to a voltage terminal of the ET PS and a RF output of the RF PA;

a plurality of ET PS transmission line switches, wherein each ET PS transmission line switch is coupled to a different point on the quarter wavelength transmission line to generate a plurality of high frequency quarter wavelength transmission lines for a plurality of specified high RFs, wherein each high frequency quarter wavelength transmission line is configured for high impedance at one of the specified high RF, and the specified high RF is higher than the specified low RF, wherein the plurality of plurality of ET PS transmission line switches are operable to be toggled to select a first ET PS transmission line switch that is the furthest away from the RF PA to set an operating frequency band of said RF PA of a high frequency, and select a second ET PS transmission line switch that is the next furthest away from the RF PA to set an operating frequency band of said RF PA of a higher frequency than the first ET PS transmission line switch.

* * * * *